US012495675B2

(12) United States Patent
  Luo

(10) Patent No.: US 12,495,675 B2
(45) Date of Patent: Dec. 9, 2025

(54) HYBRID DISPLAY DEVICE, MANUFACTURING METHOD OF HYBRID DISPLAY DEVICE, AND DISPLAY TERMINAL

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/800,493

(22) PCT Filed: Aug. 11, 2022

(86) PCT No.: PCT/CN2022/111763
§ 371 (c)(1),
(2) Date: Aug. 17, 2022

(87) PCT Pub. No.: WO2024/021167
PCT Pub. Date: Feb. 1, 2024

(65) Prior Publication Data
US 2024/0224589 A1 Jul. 4, 2024

(30) Foreign Application Priority Data
Jul. 26, 2022 (CN) .......................... 202210885032.9

(51) Int. Cl.
*H10K 59/121* (2023.01)
*H01L 25/075* (2006.01)
(Continued)

(52) U.S. Cl.
CPC ..... *H10K 59/1213* (2023.02); *H01L 25/0753* (2013.01); *H01L 25/167* (2013.01);
(Continued)

(58) Field of Classification Search
None
See application file for complete search history.

(56) References Cited

U.S. PATENT DOCUMENTS

2017/0179092 A1* 6/2017 Sasaki .................. H01L 25/075
2019/0115403 A1* 4/2019 Kang ................... H10D 86/423
(Continued)

FOREIGN PATENT DOCUMENTS

CN   109920928 A   6/2019
CN   112289945 A   1/2021
(Continued)

OTHER PUBLICATIONS

PCT International Search Report for International Application No. PCT/CN2022/111763, mailed on Dec. 22, 2022, 10pp.
PCT Written Opinion of the International Search Authority for International Application No. PCT/CN2022/111763, mailed on Dec. 22, 2022, 10pp.

*Primary Examiner* — Feifei Yeung Lopez
(74) *Attorney, Agent, or Firm* — The Roy Gross Law Firm, LLC; Roy D. Gross

(57) ABSTRACT

The present disclosure provides a hybrid display device. The hybrid display device includes: a driving backplane defined with an undercut groove; and a light-emitting structure layer including a first electrode layer, a common cathode, light-emitting elements, and first light-emitting units; the first electrode layer is electrically connected to a driving circuit layer; the first electrode layer includes first anodes, auxiliary cathodes, and second anodes, the undercut groove is adjacent to the first anodes, the common cathode is disconnected at the undercut groove, and a gap is defined between the common cathode and the first anodes.

17 Claims, 4 Drawing Sheets

(51) Int. Cl.
    *H01L 25/16* (2023.01)
    *H10H 20/831* (2025.01)
    *H10H 20/857* (2025.01)
    *H10K 59/126* (2023.01)
    *H10K 59/80* (2023.01)
    *H10K 71/60* (2023.01)
    *H10H 20/01* (2025.01)

(52) U.S. Cl.
    CPC ........ *H10H 20/831* (2025.01); *H10H 20/857* (2025.01); *H10K 59/126* (2023.02); *H10K 59/80522* (2023.02); *H10K 59/8792* (2023.02); *H10K 71/60* (2023.02); *H10H 20/032* (2025.01)

(56) References Cited

U.S. PATENT DOCUMENTS

2020/0312237 A1* 10/2020 He .................. G09G 3/3225
2021/0126224 A1*  4/2021 Lee ................. H10K 77/111

FOREIGN PATENT DOCUMENTS

| CN | 113013357 A | 6/2021 |
| CN | 113488514 A | 10/2021 |
| CN | 114864602 A | 8/2022 |
| KR | 20170015829 A | 2/2017 |

\* cited by examiner

HYBRID DISPLAY DEVICE, MANUFACTURING METHOD OF HYBRID DISPLAY DEVICE, AND DISPLAY TERMINAL

CROSS REFERENCE TO RELATED APPLICATIONS

This application is a National Phase of PCT Patent Application No. PCT/CN2022/111763 having International filing date of Aug. 11, 2022, which claims the benefit of priority of Chinese Patent Application No. 202210885032.9, filed Jul. 26, 2022, the contents of which are all incorporated herein by reference in their entirety.

FIELD OF DISCLOSURE

The present disclosure relates to a field of display technology, and particularly to a hybrid display device, a manufacturing method of the hybrid display device, and a display terminal.

BACKGROUND OF DISCLOSURE

An efficiency and a stability of R and G chips in micro-LED displays are far inferior to an efficiency and a stability of R and G chips in QLED and OLED devices, so a hybrid display device including micro-LED chips and QLED light-emitting units is proposed. Firstly, the micro-LED chips are transferred to a driving backplane and QLED light-emitting units are prepared on the driving backplane, and then a common cathode is formed on the QLED light-emitting units. From a point of view of production cost and production accuracy, the common cathode is generally formed through a full-surface deposition method, which will make the common cathode to be short-circuited with anodes of the Micro-LED chips, causing the hybrid display device to fail.

SUMMARY OF DISCLOSURE

Technical Problem

Forming the common cathode through a full-surface deposition method will make the common cathode to be short-circuited with the anodes of the Micro-LED chips, causing the hybrid display device to fail.

Technical Solutions

In view of this, the present disclosure provides a hybrid display device, a manufacturing method of the hybrid display device, and a display terminal that can avoid device failure due to short circuit of an anode of a Micro-LED chip.

For solving problems as above, the technical solutions provided by the present disclosure are as follows:

In a first aspect, the present disclosure provides a hybrid display device, comprising:

a driving backplane comprising a driving circuit layer, a first passivation protection layer, and a pressure-resistant layer stacked in sequence; wherein the driving backplane is defined with at least one undercut groove, and the undercut groove penetrates the first passivation protection layer and the pressure-resistant layer; and a light-emitting structure layer comprising an electrode layer, a common cathode, a plurality of light-emitting elements, and a plurality of first light-emitting units; wherein the electrode layer is formed on the pressure-resistant layer and is electrically connected to the driving circuit layer, the light-emitting elements and the first light-emitting units are all formed on the electrode layer, and the common cathode is formed on the first light-emitting units;

wherein the electrode layer comprises a plurality of first anodes, a plurality of auxiliary cathodes, and a plurality of second anodes, and the light-emitting elements are bonded to the driving backplane through the first anodes and the auxiliary cathodes; the first light-emitting units are formed between the second anodes and the common cathodes; the undercut groove is adjacent to the first anode, the common cathode is disconnected at the undercut groove, and a gap is provided between the common cathode and the first anode.

In an optional embodiment of the present disclosure, the driving circuit layer comprises a plurality of first driving transistors, each of the first driving transistors comprises a first source and a first drain; the undercut groove comprises a first groove and a second groove, the first groove penetrates the pressure-resistant layer, and the second groove penetrates the first passivation protection layer; the first groove is arranged opposite to the second groove, and a size of an opening of the first groove adjacent to the second groove is less than a size of an opening of the second groove adjacent to the first groove;

a part of the first drain is exposed from the second groove, and the first anode is electrically connected to the first drain.

In an optional embodiment of the present disclosure, each of the first driving transistors further comprises a signal input terminal, the signal input terminal, the first source, and the first drain are arranged on a same layer, and the auxiliary cathode is electrically connected to the signal input terminal.

In an optional embodiment of the present disclosure, the auxiliary cathode is electrically connected to the common cathode.

In an optional embodiment of the present disclosure, a thickness of the pressure-resistant layer corresponding to the first driving transistors is less than a thickness of the pressure-resistant layer corresponding to the first anodes.

In an optional embodiment of the present disclosure, the driving backplane further comprises a light-shielding layer formed on the pressure-resistant layer and is opposite to the first driving transistor; a surface of the light-shielding layer away from the first driving transistor and surfaces of the first anodes away from the pressure-resistant layer are on a same horizontal plane.

In an optional embodiment of the present disclosure, the driving backplane further comprises a plurality of second driving transistors and a plurality of third driving transistors; the first electrode layer further comprises a plurality of third anodes;

the second anode is arranged corresponding to the second driving transistor, and is electrically connected to the second driving transistor;

the light-emitting structure layer further comprises a plurality of second light-emitting units, each of the second light-emitting units is formed between the third anode and the common cathode, and the third anode is electrically connected to the third driving transistor.

In an optional embodiment of the present disclosure, a thickness of the pressure-resistant layer corresponding to the second driving transistor and the third driving transistor is less than a thickness of the pressure-resistant layer corresponding to the first anodes.

In an optional embodiment of the present disclosure, the light-emitting elements are light-emitting diode elements emitting blue light, the first light-emitting units are organic light-emitting units or quantum dot light-emitting units emitting green light, and the second light-emitting units are organic light-emitting units or quantum dot light-emitting units emitting red light.

In an optional embodiment of the present disclosure, the light-emitting structure layer further comprises a plurality of first blocking wall, a plurality of second blocking wall, and a plurality of third blocking wall formed on the pressure-resistant layer, and the common cathode covers the first blocking wall, the second blocking wall, and the third blocking wall;
- the first blocking wall are arranged between the auxiliary cathode and the second anode; the second blocking wall are arranged between the second anode and the third anode, and the third blocking wall are arranged on an outer side of the third anode;
- a first pixel opening is provided between the first blocking wall and the second blocking wall, and a second pixel opening is provided between the second blocking wall and the third blocking wall;
- the first light-emitting unit is disposed in the first pixel opening, and the second light-emitting unit is disposed in the second pixel opening.

In an optional embodiment of the present disclosure, in a same etching solution, an etching resistance of the pressure-resistant layer is better than an etching resistance of the first passivation protection layer.

In a second aspect, the present disclosure provides a manufacturing method of a hybrid display device, comprising:
- providing a driving substrate and forming a pressure-resistant layer on the driving substrate to obtain a driving backplane; wherein the driving substrate comprises a driving circuit layer and a first passivation protection layer formed on the driving circuit layer, and the pressure-resistant layer is formed on the first passivation protection layer;
- forming an electrode layer on the pressure-resistant layer, defining at least one first groove recessed from the pressure-resistant layer to the driving circuit layer; wherein a part of the first passivation protection layer is exposed from the first groove, the electrode layer comprises a plurality of first anodes, a plurality of auxiliary cathodes, and a plurality of second anodes, and the first groove is adjacent to the first anode;
- etching the first passivation protection layer exposed from the first groove to form at least one second groove; wherein one of the first grooves and one of the second grooves corresponding to the first groove form an undercut groove;
- providing a plurality of light-emitting elements and a plurality of first light-emitting units, binding the light-emitting elements on the first anodes and the auxiliary cathodes, and forming the first light-emitting units on the second anodes; and
- forming a common cathode on the light-emitting elements, the first light-emitting units, and the pressure-resistant layer through a full-surface deposition method to form a light-emitting structure layer; wherein the common cathode is disconnected at the undercut groove, and a gap is provided between the common cathode and the first anode.

In an optional embodiment of the present disclosure, the auxiliary cathode is electrically connected to the common cathode.

In an optional embodiment of the present disclosure, the driving circuit layer comprises a plurality of first driving transistors, a thickness of the pressure-resistant layer corresponding to the first driving transistors is less than a thickness of the pressure-resistant layer corresponding to the first anodes; a surface of the pressure-resistant layer away from the first driving transistor is on a same horizontal plane; after a step of etching the first passivation protection layer exposed from the first groove to form at least one second groove, the manufacturing method further comprises a step of:
- forming a light-shielding layer on a surface of the pressure-resistant layer opposite to the first driving transistor;
- wherein a surface of the light-shielding layer away from the first driving transistor and surfaces of the first anodes away from the pressure-resistant layer are on a same horizontal plane.

In a third aspect, the present disclosure provides a display terminal, wherein the display terminal comprises a body portion and a hybrid display device formed on the body portion, and the hybrid display device comprises:
- a driving backplane comprising a driving circuit layer, a first passivation protection layer, and a pressure-resistant layer stacked in sequence; wherein the driving backplane is defined with at least one undercut groove, and the undercut groove penetrates the first passivation protection layer and the pressure-resistant layer; and
- a light-emitting structure layer comprising an electrode layer, a common cathode, a plurality of light-emitting elements, and a plurality of first light-emitting units; wherein the electrode layer is formed on the pressure-resistant layer and is electrically connected to the driving circuit layer, the light-emitting elements and the first light-emitting units are all formed on the electrode layer, and the common cathode is formed on the first light-emitting unit;
- wherein the electrode layer comprises a plurality of first anodes, a plurality of auxiliary cathodes, and a plurality of second anodes, and the light-emitting elements are bond to the driving backplane through the first anodes and the auxiliary cathodes; the first light-emitting units are formed between the second anodes and the common cathodes; the undercut groove is adjacent to the first anodes, the common cathode is disconnected at the undercut groove, and a gap is provided between the common cathode and the first anodes.

In an optional embodiment of the present disclosure, the driving circuit layer comprises a plurality of first driving transistors, each of the first driving transistors comprises a first source and a first drain; the undercut groove includes a first groove and a second groove, the first groove penetrates the pressure-resistant layer, and the second groove penetrates the first passivation protection layer; the first groove is arranged opposite to the second groove, and a size of an opening of the first groove adjacent to the second groove is less than a size of an opening of the second groove adjacent to the first groove;
- a part of the first drain is exposed from the second groove, and the first anode is electrically connected to the first drain.

In an optional embodiment of the present disclosure, each of the first driving transistors further comprises a signal input terminal, the signal input terminal is arranged in a same layer as the first source, and the first drain are arranged on a same layer, and the auxiliary cathode is electrically connected to the signal input terminal.

In an optional embodiment of the present disclosure, the auxiliary cathode is electrically connected to the common cathode.

In an optional embodiment of the present disclosure, a thickness of the pressure-resistant layer corresponding to the first driving transistors is less than a thickness of the pressure-resistant layer corresponding to the first anodes.

In an optional embodiment of the present disclosure, the driving backplane further comprises a light-shielding layer formed on the pressure-resistant layer and is opposite to the first driving transistor; a surface of the light-shielding layer away from the first driving transistor and surfaces of the first anodes away from the pressure-resistant layer are on a same horizontal plane.

Beneficial Effect

In the hybrid display device, the manufacturing method of the hybrid display device, and the display terminal provided by the present disclosure, a pressure-resistant layer is formed on the first passivation protection layer of the driving backplane, and a first anode, and a second anode, and an auxiliary cathode are formed on the pressure-resistant layer, an undercut groove is provided at a position adjacent to the first anode of the pressure-resistant layer of the driving substrate and the first passivation protective layer of the driving substrate, the light-emitting element is bond to the first anode and the auxiliary cathode, the light-emitting unit is formed on the first anode, and finally the common cathode is formed on the light-emitting unit. Due to the existence of the undercut groove, the common cathode is disconnected at the undercut groove to cut off an electrical contact between the first anodes and the common cathode, so that a device failure caused by a short circuit of the first anode caused by an overlap joint between the common cathode and the first anode can be avoided.

BRIEF DESCRIPTION OF DRAWINGS

In order to explain technical solutions in the prior art more clearly, the following will briefly introduce drawings involved in a following description of the embodiments or the prior art. Obviously, the drawings in the following description are only some embodiments of the present disclosure, for those skilled in the art, other drawings can be obtained from these drawings without creative work.

DETAILED DESCRIPTION OF EMBODIMENTS

Figure 1:
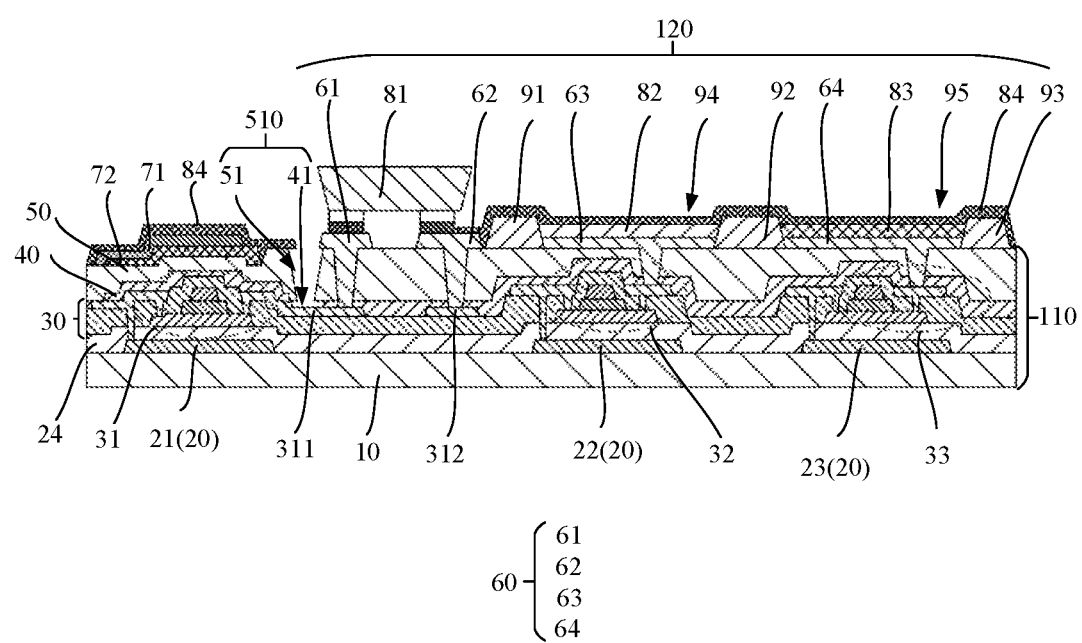
FIG. 1 is a cross-sectional view of a hybrid display device according to a preferred embodiment of the present disclosure.

The technical solutions in the embodiments of the present disclosure will be clearly and completely described in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work shall fall within a protection scope of the present disclosure.

In the description of the present disclosure, it should be understood that, an orientation or positional relationship indicated by terms "upper", "lower", etc. are based on an orientation or positional relationship shown in the drawings, and is only for convenience of describing the disclosure and simplifying the description. It does not indicate or imply that a pointed device or an element must have a specific orientation, or be configured and operated in a specific orientation, and therefore it cannot be understood as a limitation of the present disclosure. In addition, terms "first" and "second" are only used for descriptive purposes, and cannot be understood as indicating or implying relative importance or implicitly indicating a number of indicated technical features. Therefore, the features defined with "first" and "second" may explicitly or implicitly include one or more of the features. In the description of the present disclosure, "a plurality of" means two or more, unless otherwise specifically defined.

The present disclosure may repeat reference numerals and/or reference letters in different implementations, and this repetition is for a purpose of simplification and clarity, and does not indicate a relationship between various embodiments and/or settings discussed.

A hybrid display device, a manufacturing method of the hybrid display device and a display terminal provided by the present disclosure will be described in detail below in conjunction with specific embodiments.

Please refer to FIG. 1, a preferred embodiment of the present disclosure provides a hybrid display device 100, the hybrid display device 100 includes a driving backplane 110, and a light-emitting structure layer 120. The light-emitting structure layer 120 is formed on one side of the driving backplane 110. The driving backplane 110 is used to drive the light-emitting structure layer 120 to emit light.

Wherein the driving backplane 110 includes a substrate 10, a driving circuit layer 30, a first passivation protection layer 40, and a pressure-resistant layer 50. The driving circuit layer 30 is formed on the substrate 10, the first passivation protection layer 40 is formed on the driving circuit layer 30, the pressure-resistant layer 50 is formed on the first passivation protection layer 40, and the light-emitting structure layer 120 is formed on the pressure-resistant layer 50.

Wherein the driving backplane 110 is defined with at least one undercut groove 510, the undercut groove 510 penetrates the first passivation protection layer 40 and the pressure-resistant layer 50. Specifically, the undercut groove 510 includes a first groove 51 and a second groove 41, the first groove 51 penetrates the pressure-resistant layer 50, the second groove 41 penetrates the first passivation protection layer 40; the first groove 51 is disposed opposite to the second groove 41, a size of an opening of the first groove 51 adjacent to the second groove 41 is less than a size of an opening of the second groove 41 adjacent to the first groove 51.

Wherein in a same etching solution, an etching resistance of the pressure-resistant layer 50 is better than an etching resistance of the first passivation protection layer 40, so as to easily perform a lateral etching on a contact surface of the first passivation protection layer 40 and the pressure-resistant layer 50 to define the second groove 41 and the undercut groove 510.

Wherein the driving circuit layer 30 further includes a plurality of first driving transistors 31, a plurality of second driving transistors 32, and a plurality of third driving transistors 33. The first driving transistors 31, the second driving transistors 32, and the third driving transistors 33 are respectively arranged on the substrate 10, the first passivation protection layer 40 covers the first driving transistors 31, the second driving transistors 32, and the third driving transistors 33.

Specifically, the driving circuit layer 30 further includes an active layer (not numbered in the figures), a gate insulating layer (not numbered in the figures), a gate (not numbered in the figure), and a first interlayer insulating layer (not numbered in the figures), and source and drain layer (not numbered in the figures), the active layer is formed on the substrate 10, the gate insulating layer is located between the gate and the active layer, the first interlayer insulating layer is located between the gate and the source and drain layer, and the first passivation protection layer 40 covers the source and drain layer. Wherein, the active layer includes a first semiconductor (not numbered in the figures), a second semiconductor (not numbered in the figures), and a third semiconductor (not numbered in the figures); the gate includes a first gate (not numbered in the figures), a second gate (not numbered in the figures), and a third gate (not numbered in the figures); and the source and drain layer include a first source (not numbered in the figures), a first drain 311, a second source (not numbered in the figures), a second drain (not numbered in the figures), and a third source (not numbered in the figures), and a third drain (not numbered in the figures). The first semiconductor, the first gate, the first source, and the first drain 311 are located opposite to each other to form the first driving transistors 31. The second semiconductor, the second gate, the second source, and drain are positioned opposite to each other to form the second driving transistors 32. The third semiconductor, the third gate, the third source, and drain are positioned opposite to each other to form the third driving transistors 33. A part of the first source and the first drain 311 are exposed from the undercut groove 510.

Wherein each of the first driving transistors 31 further includes a signal input terminal 312. The signal input terminal 312, the first source, and the first drain 311 are arranged on a same layer and made of a same material. The signal input terminal 312 is used to input a driving signal of a common cathode.

In an optional embodiment of the present disclosure, a thickness of the pressure-resistant layer 50 is from 3 μm to 5 μm.

Wherein the pressure-resistant layer 50 can be as a buffer layer of the first driving transistors 31, the second driving transistors 32, and the third driving transistors 33. The pressure-resistant layer 50 can reduce the impact on the first driving transistors 31, the second driving transistors 32 and the third driving transistors 33 when the driving backplane 110 is subjected to external impact or collision, etc.

In this embodiment, a material of the pressure-resistant layer 50 is an organic photoresist material.

In an optional embodiment of the present disclosure, the driving backplane 110 further includes a metal-shielding layer 20 and a second interlayer insulating layer 24, the metal-shielding layer 20 is formed on the substrate 10, and the second interlayer insulating layer 24 covers the metal-shielding layer 20. The metal-shielding layer 20 includes a first metal-shielding portion 21, a second metal-shielding portion 22, and a third metal-shielding portion 23. The first metal-shielding portion 21 is opposite to the first driving transistors 31 and is electrically connected to the first drain 311. The second metal-shielding portion 22 is opposite to the second driving transistors 32 and is electrically connected to the second drain. The third metal-shielding portion 23 is opposite to the third driving transistors 33 and is electrically connected to the third drain. Wherein, the first metal-shielding portion 21 is used to shield external stray light and also serves as a driving signal input terminal of the first driving transistor 31; the second metal-shielding portion 22 is used to shield external stray light and also serves as a driving signal input terminal of the second driving transistor 32; and the third metal-shielding portion 23 is used to shield external stray light, and also serves as a driving signal input terminal of the third driving transistor 33.

In an optional embodiment of the present disclosure, a thickness of the pressure-resistant layer 50 corresponding to at least one of the first driving transistors 31, the second driving transistors 32, and the third driving transistors 33 is less than a thickness of the pressure-resistant layer 50 not corresponding to the first driving transistors 31, the second driving transistors 32, and the third driving transistors 33. A surface of the pressure-resistant layer 50 parallel to the substrate 10 and away from the first driving transistors 31 is on a same horizontal plane.

In an optional embodiment of the present disclosure, the driving backplane 110 further includes a light-shielding layer 72, the light-shielding layer 72 is formed on the pressure-resistant layer 50 and opposite to the first driving transistors 31. Wherein the light-shielding layer 72 can not only be used to shield the external stray light from a direction of the light-emitting structure layer 120, but also can adjust a thickness of the light-shielding layer 72.

In an optional embodiment of the present disclosure, the driving backplane 110 further includes a second passivation protection layer 71, the second passivation protection layer 71 is formed on the pressure-resistant layer 50 and opposite to the first driving transistor 31. The light-shielding layer 72 is formed on the second passivation protection layer 71. Wherein the second passivation protection layer 71 is not only used to adjust a flatness of a surface of the pressure-resistant layer 50 away from the first driving transistors 31 when a region of the pressure-resistant layer 50 corresponding to the first driving transistors 31 is uneven, but also reduce the thickness of the light-shielding layer 72 to a certain degree.

Wherein the light-emitting structure layer 120 includes an electrode layer 60, a common cathode 84, a plurality of light-emitting elements 81, and a plurality of first light-emitting units 82. The electrode layer 60 is formed on the pressure-resistant layer 50 and is electrically connected to the driving circuit layer 30. The light-emitting elements 81 and the first light-emitting units 82 are all formed on the electrode layer 60. The common cathode 84 is formed on the first light-emitting units 82 and the light-shielding layer 72.

Wherein the electrode layer 60 includes a plurality of first anodes 61, a plurality of auxiliary cathodes 62, and a plurality of second anodes 63. The light-emitting element 81 is bonded to the driving backplane 110 through the first anode 61 and the auxiliary cathode 62. The first light-emitting unit 82 is formed on the second anode 63 and disposed between the second anode 63 and the common cathode 84. The undercut groove 510 is adjacent to the first anode 61, the common cathode 84 is disconnected at the undercut groove 510, and a gap is defined between the common cathode 84 and the first anode 61. That is, there is no overlap between the common cathode 84 and the first anode 61. In this way, an electrical contact between the common cathode 84 and the first anode 61 can be cut off so that a device failure caused by a short circuit of the first anode 61 caused by an overlap joint between the common cathode 84 and the first anode 61 can be avoided.

Specifically, the first anode 61 is electrically connected to the first drain 311 of the first driving transistor 31, the auxiliary cathode 62 is electrically connected to the signal input terminal 312 and the common cathode 84, and the second anode 63 is electrically connected to the second drain of the second driving transistor 32.

In an optional embodiment of the present disclosure, the electrode layer 60 further includes a plurality of third anodes 64, the third anodes 64 are electrically connected to the third drains of the third driving transistors 33.

In an optional embodiment of the present disclosure, the light-emitting structure layer 120 further includes a plurality of second light-emitting units 83, the second light-emitting units 83 are formed on the third anodes 64 and disposed between the third anodes 64 and the common cathode 84.

Of course, in other embodiments of the present disclosure, the light-emitting structure layer 120 may further include more than one light-emitting element 81 and/or more than one light-emitting unit, which may be designed according to actual needs.

The light-emitting element 81 has a different light-emitting principle from the first light-emitting unit 82 and the second light-emitting unit 83. The light-emitting element 81, the first light-emitting unit 82, and the second light-emitting unit 83 emit light of different colors. In this embodiment, the light-emitting element 81 emits blue light, the first light-emitting unit 82 emits green light, and the second light-emitting unit 83 emits red light. Of course, in other embodiments, the color of the light emitted by the light-emitting element 81, the first light-emitting unit 82 and the second light-emitting unit 83 is not limited to red, green, and blue, and may also be light of other colors.

In an optional embodiment of the present disclosure, the light-emitting element 81 is a light-emitting diode (LED) chip. In other embodiments, the light-emitting element 81 may also be a sub-millimeter light-emitting diode (mini-LED) chip or a micron light-emitting diode (Micro-LED) chip, etc.

In an optional embodiment of the present disclosure, light-emitting manners of the first light-emitting unit 82 and the second light-emitting unit 83 are quantum dot light-emitting. In other embodiments, the light-emitting manners of the first light-emitting unit 82 and the second light-emitting unit 83 may also be organic material light-emitting or the like.

Each of the first light-emitting units 82 and each of the second light-emitting units 83 both include a light-emitting material layer, an electron injection layer, a hole injection layer, an electron transport layer, a hole transport layer, and the like. Positions of the electron injection layer, the hole injection layer, the electron transport layer, and the hole transport layer are the same as the electron injection layer, the hole injection layer, the electron transport layer, and the hole transport layer of a quantum dot light-emitting diode or an organic light-emitting diode in the prior art.

In an optional embodiment of the present disclosure, a thickness of the pressure-resistant layer 50 corresponding to at least one of the first driving transistors 31, the second driving transistors 32, and the third driving transistors 33 is less than a thickness of the pressure-resistant layer 50 corresponding to the first anodes 61, the auxiliary cathode 62, the second anode 63, and the third anode 64. In this way, a height difference between the first anode 61 and the pressure-resistant layer 50 located above the first driving transistors 31 and the transistor 32 can be reduced, and a height difference between the auxiliary cathode 62 and the pressure-resistant layer 50 located above the first driving transistors 31 and the transistor 32 can be reduced.

When the light-emitting element 81 is a Micro-LED chip, a volume of the Micro-LED chip is small, and a height of connection terminals of the Micro-LED chip is only 1 μm to 2 μm. However, in the prior art, a height difference between an upper surface of a driving transistor for driving the Micro-LED chip and the first anode for binding the Micro-LED chip is larger, and a height difference between an upper surface of a driving transistor for driving the Micro-LED chip and the auxiliary cathode for binding the Micro-LED chip is larger, too. When binding the Micro-LED chip, the height difference will cause the connection terminals on the Micro-LED chip to be unable to bond well with the first anode and the auxiliary cathode on the driving backplane, resulting in transfer and binding yields of the Micro-LED chips mentioned above being relatively low, resulting in problems such as dark lights, light outages, and dark spots. Therefore, in the present disclosure, the height difference between the first anode 61 and the pressure-resistant layer 50 above the first driving transistor 31 and the second driving transistor 32 is reduced, and the height difference between the auxiliary cathode 62 and the pressure-resistant layer 50 above the first driving transistor 31 and the second driving transistor 32 is reduced, the transfer and binding yields of the light-emitting element 81 can be improved, so that problems such as dark lights, light outages, and dark spots in the hybrid display device 100 can be avoided.

Preferably, the surface of the pressure-resistant layer 50 parallel to the substrate 10 and away from the first driving transistor 31 is on the same horizontal plane.

In an optional embodiment of the present disclosure, a surface of the light-shielding layer 72 away from the first driving transistor 31 and a surface of the first anode 61 away from the pressure-resistant layer 50 are on a same horizontal plane, the height difference between the first anode 61 and the pressure-resistant layer 50 above the driving transistor 31 and the second driving transistor 32 is 0, and the height difference between the auxiliary cathode 62 and the pressure-resistant layer 50 above the driving transistor 31 and the second driving transistor 32 is 0, which can further improve the transfer and binding yields of the light-emitting element 81.

In an optional embodiment of the present disclosure, the light-emitting structure layer 120 further includes a first blocking wall 91, a second blocking wall 92, and a third blocking wall 93 formed on the pressure-resistant layer 50, and the common cathode 84 covers the first blocking wall 91, the second blocking wall 92, and the third blocking wall 93; the first blocking wall 91 are arranged between the auxiliary cathode 62 and the second anode 63; the second blocking wall 92 is arranged between the second anode 63 and the third anode 64, and the third blocking wall 93 is arranged on an outer side of the third anode 64; a first pixel opening 94 is defined between the first blocking wall 91 and the second blocking wall 92, and a second pixel opening 95 is defined between the second blocking wall 92 and the third blocking wall 93; and the first light-emitting unit 82 is disposed in the first pixel opening 94, and the second light-emitting unit 83 is disposed in the second pixel opening 95.

In other embodiments, a number of blocking wall included in the light-emitting structure layer 120 depends on a number of light-emitting units included in the light-emitting structure layer 120, and the number of the blocking wall is one more than the number of the light-emitting units.

Figure 2:
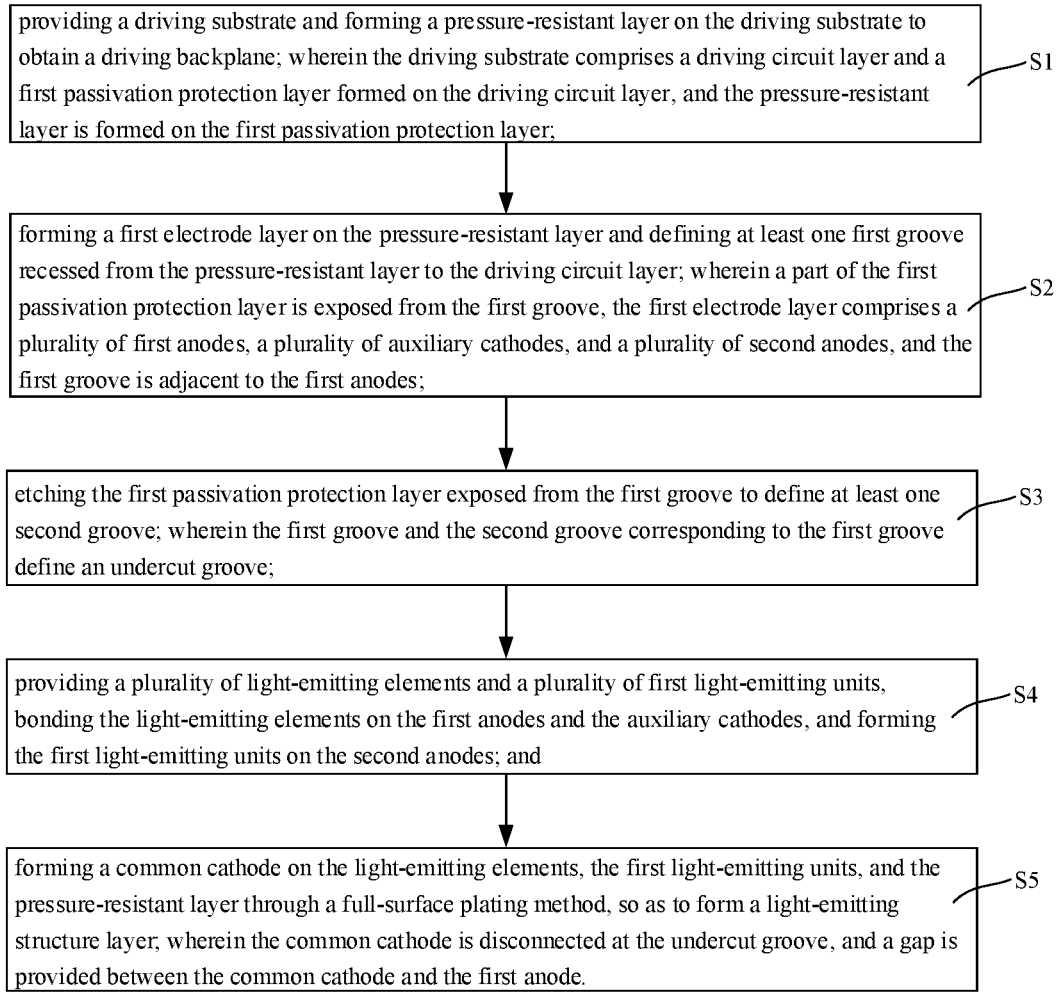
FIG. 2 is a schematic view of a manufacturing process of a hybrid display device provided by a preferred embodiment of the present disclosure.
Figure 3:
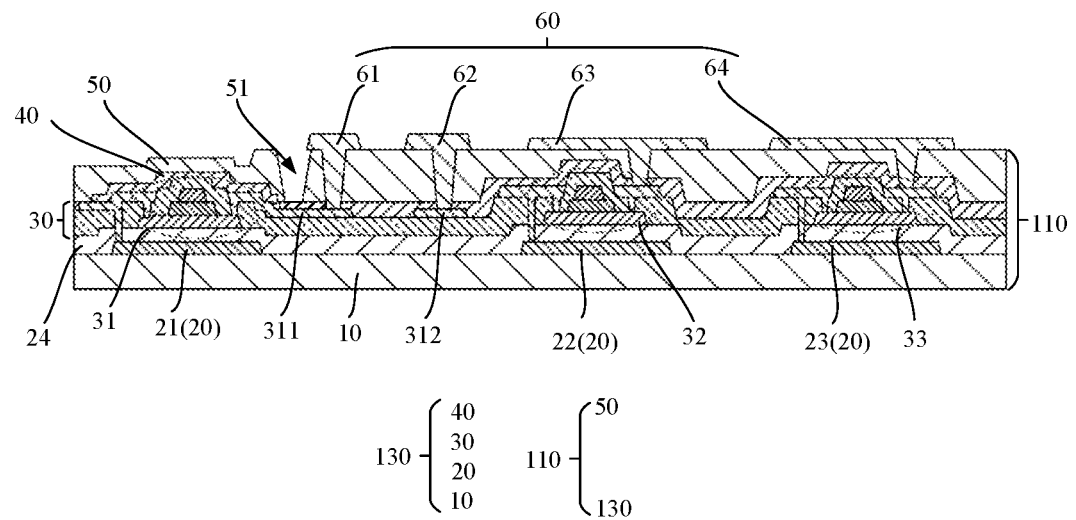
FIG. 3 is a cross-sectional view of a driving backplane with an electrode layer provided by a preferred embodiment of the present disclosure.

Referring to FIGS. 2 to 5, a second aspect of the present disclosure provides a manufacturing method of a hybrid display device 100, including steps:

S1: please refer to FIGS. 2 and 3, providing a driving substrate 130 and forming a pressure-resistant layer 50 on the driving substrate 130 to obtain a driving backplane 110; wherein the driving backplane 110 includes a driving circuit layer 30 and a first passivation protection layer 40 formed on the driving circuit layer 30, and the pressure-resistant layer 50 is formed on the first passivation protection layer 40.

Wherein, in a same etching solution, an etching resistance of the pressure-resistant layer 50 is better than an etching resistance of the first passivation protection layer 40.

In an optional embodiment of the present disclosure, a thickness of the pressure-resistant layer 50 is from 3 μm to 5 μm.

Wherein the pressure-resistant layer 50 can be as a buffer layer of a first driving transistor 31, a second driving transistor 32, and a third driving transistor 33.

In this embodiment, a material of the pressure-resistant layer 50 is an organic photoresist material.

Wherein the driving substrate 130 includes a substrate 10, and the driving circuit layer 30 is formed on the substrate 10.

Wherein the driving circuit layer 30 further includes a plurality of first driving transistors 31, a plurality of second driving transistors 32, and a plurality of third driving transistors 33. The first driving transistors 31, the second driving transistors 32, and the third driving transistors 33 are respectively arranged on the substrate 10, the first passivation protection layer 40 covers the first driving transistors 31, the second driving transistors 32, and the third driving transistors 33.

Specifically, the driving circuit layer 30 further includes an active layer (not numbered in the figures), a gate insulating layer (not numbered in the figures), a gate (not numbered in the figure), and a first interlayer insulating layer (not numbered in the figures) and source and drain layer (not numbered in the figures), the active layer is formed on the substrate 10, the gate insulating layer is located between the gate and the active layer, the first interlayer insulating layer is located between the gate and the source and drain layer, and the first passivation protection layer 40 covers the source and drain layer. Wherein, the active layer includes a first semiconductor (not numbered in the figures), a second semiconductor (not numbered in the figures) and a third semiconductor (not numbered in the figures), and the gate includes a first gate (not numbered in the figures), a second gate (not numbered in the figures) and a third gate (not numbered in the figures), the source and drain layer include a first source (not numbered in the figures), a first drain 311, a second source (not numbered in the figures), a second drain (not numbered in the figures), and a third source (not numbered in the figures), and a third drain (not numbered in the figures). The first semiconductor, the first gate, the first source, and the first drain 311 are located opposite to each other to form the first driving transistors 31. The second semiconductor, the second gate, the second source, and the second drain are positioned opposite to each other to form the second driving transistors 32. The third semiconductor, the third gate, the third source, and the third drain are positioned opposite to each other to form the third driving transistors 33.

Wherein each of the first driving transistors 31 further includes a signal input terminal 312. The signal input terminal 312, the first source, and the first drain 311 are arranged on a same layer and made of a same material. The signal input terminal 312 is used to input a driving signal of a common cathode.

In an optional embodiment of the present disclosure, the driving backplane 110 further includes a metal-shielding layer 20 and a second interlayer insulating layer 24, the metal-shielding layer 20 is formed on the substrate 10, and the second interlayer insulating layer 24 covers the metal-shielding layer 20. The metal-shielding layer 20 includes a first metal-shielding portion 21, a second metal-shielding portion 22, and a third metal-shielding portion 23. The first metal-shielding portion 21 is opposite to the first driving transistors 31 and is electrically connected to the first drain 311. The second metal-shielding portion 22 is opposite to the second driving transistors 32 and is electrically connected to the second drain. The third metal-shielding portion 23 is opposite to the third driving transistors 33 and is electrically connected to the third drain.

S2: please refer to FIGS. 2 and 3 again, forming an electrode layer 60 on the pressure-resistant layer 50, forming at least one first groove 51 recessed from the pressure-resistant layer 50 to the driving circuit layer 30; wherein a part of the first passivation protection layer 40 is exposed from the first groove 51, the electrode layer 60 includes a plurality of first anodes 61, a plurality of auxiliary cathodes 62, and a plurality of second anodes 63, and the first groove 51 is adjacent to the first anodes 61.

Specifically, the first anode 61 is electrically connected to the first drain 311 of the first driving transistor 31, and the auxiliary cathode 62 is electrically connected to the signal input terminal 312. The second anode 63 is electrically connected to the second drain of the second driving transistor 32.

In an optional embodiment of the present disclosure, the electrode layer 60 further includes a plurality of third anodes 64, the third anodes 64 are electrically connected to the third drains of the third driving transistors 33.

Wherein, a thickness of the pressure-resistant layer 50 corresponding to at least one of the first driving transistors 31, the second driving transistors 32, and the third driving transistors 33 is less than a thickness of the pressure-resistant layer 50 corresponding to the electrode layer 60. In this way, a height difference between the first anode 61 and the pressure-resistant layer 50 located above the first driving transistors 31 and the transistor 32 can be reduced, and a height difference between the auxiliary cathode 62 and the pressure-resistant layer 50 located above the first driving transistors 31 and the transistor 32 can be reduced. Preferably, a surface of the pressure-resistant layer 50 parallel to the substrate 10 and away from the first driving transistor 31 are on a same horizontal plane.

Figure 4:
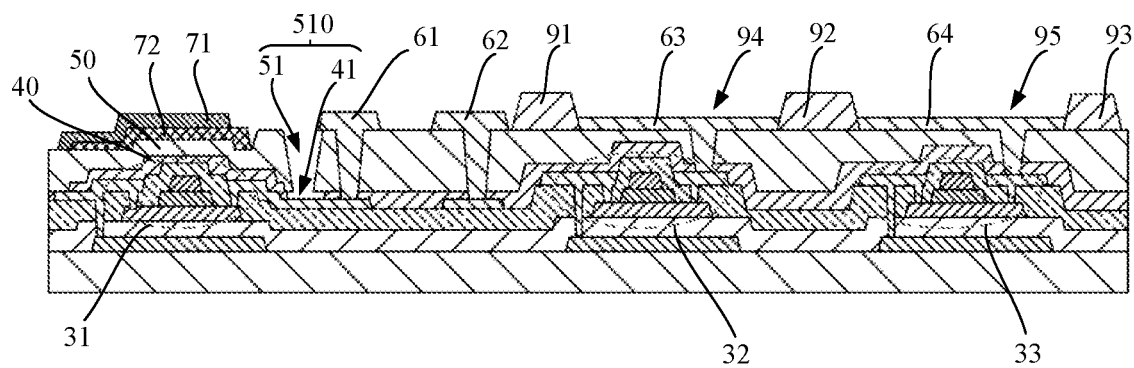
FIG. 4 is a cross-sectional view after forming a light-shielding layer, an undercut groove, and a blocking wall on the driving backplane shown in FIG. 3.

S3: please refer to FIGS. 2 and 4, etching the first passivation protection layer 40 exposed from the first groove 51 to define second groove 41; wherein one of the first grooves 51 and one of the second grooves second groove 41 corresponding to the first groove 51 define an undercut groove 510.

Wherein the second groove 41 penetrates the first passivation protection layer 40.

Wherein, the S3 further includes a step of: forming a light-shielding layer 72 on a surface of the pressure-resistant layer 50 corresponding to the first driving transistor 31, and the light-shielding layer 72 not only can be used to shield the external stray light from a direction of the light-emitting structure layer 120, but can also adjust a thickness of the light-shielding layer 72. Wherein the light-shielding layer 72 may be formed before defining the second groove 41, or may be formed after defining the second groove 41.

In an optional embodiment of the present disclosure, a surface of the light-shielding layer 72 away from the first driving transistor 31 and a surface of the first anode 61 away from the pressure-resistant layer 50 are on a same horizontal plane, a height difference between the first anode 61 and the pressure-resistant layer 50 above the driving transistor 31 and the second driving transistor 32 is 0, and a height difference between the auxiliary cathode 62 and the pressure-resistant layer 50 above the driving transistor 31 and the second driving transistor 32 is 0, which can further improve transfer and binding yields of light-emitting elements 81.

In an optional embodiment of the present disclosure, the driving backplane 110 further includes a second passivation protection layer 71, the second passivation protection layer 71 is formed on the pressure-resistant layer 50 and opposite to the first driving transistors 31. The light-shielding layer 72 is formed on the second passivation protection layer 71. Wherein the second passivation protection layer 71 is not only used to adjust a flatness of a surface of the pressure-resistant layer 50 away from the first driving transistors 31 when a region of the pressure-resistant layer 50 corresponding to the first driving transistors 31 is uneven, but also reduce a thickness of the light-shielding layer 72 to a certain degree.

Figure 5:
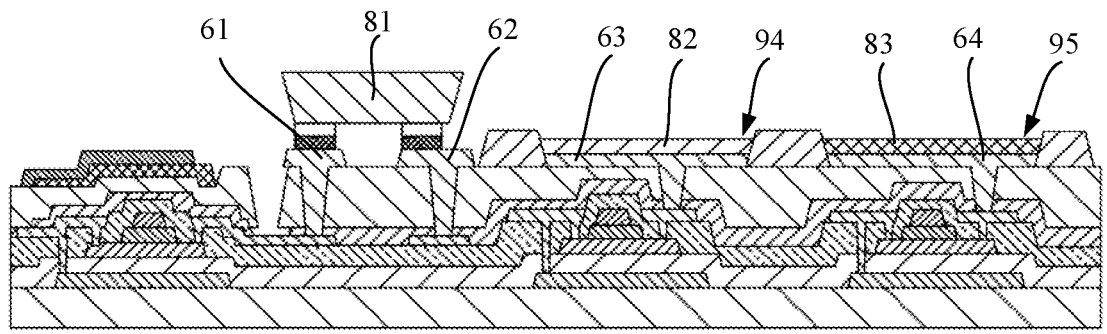
FIG. 5 is a cross-sectional view after transferring light-emitting elements to the driving backplane shown in FIG. 4.

S4: please refer to FIGS. 2 and 5, providing a plurality of light-emitting elements 81 and a plurality of first light-emitting units 82, binding the light-emitting elements 81 on the first anodes 61 and the auxiliary cathodes 62, and forming the light-emitting elements 81 on the second anodes 63.

In the S4, the manufacturing method further includes steps: forming a plurality of first blocking wall 91, a plurality of second blocking wall 92, and a plurality of third blocking wall 93 on the pressure-resistant layer 50. The first blocking wall 91 is arranged between the auxiliary cathode 62 and the second anode 63; the second blocking wall 92 is arranged between the second anode 63 and the third anode 64, and the third blocking wall 93 is arranged on an outer side of the third anode 64. A first pixel opening 94 is defined between the first blocking wall 91 and the second blocking wall 92, and a second pixel opening 95 is defined between the second blocking wall 92 and the third blocking wall 93. The first light-emitting unit 82 is disposed in the first pixel opening 94, and the second light-emitting unit 83 is disposed in the second pixel opening 95. Wherein, the first blocking wall 91, the second blocking wall 92, and the third blocking wall 93 can be formed before the step of "binding the light-emitting elements 81 on the first anodes 61 and the auxiliary cathodes 62", or may be formed after the step of "binding the light-emitting elements 81 on the first anodes 61 and the auxiliary cathodes 62".

S5: please refer to FIGS. 1 and 2, forming a common cathode 84 on the light-emitting elements 81, the first light-emitting units 82, and the pressure-resistant layer 50 through a full-surface deposition method to form a light-emitting structure layer 120; wherein the common cathode 84 is disconnected at the undercut groove 510, and a gap is defined between the common cathode 84 and the first anode 61.

Wherein, the auxiliary cathode 62 is electrically connected to the common cathode 84.

Of course, in other embodiments of the present disclosure, the light-emitting structure layer 120 may further include more than one light-emitting element 81 and/or more than one light-emitting unit, which may be designed according to actual needs.

The light-emitting element 81 has a different light-emitting principle from the first light-emitting unit 82 and the second light-emitting unit. The light-emitting element 81, the first light-emitting unit 82 and the second light-emitting unit emit light of different colors. In this embodiment, the light-emitting element 81 emits blue light, the first light-emitting unit 82 emits green light, and the second light-emitting unit emits red light. Of course, in other embodiments, the color of the light emitted by the light-emitting element 81, the first light-emitting unit 82 and the second light-emitting unit is not limited to red, green, and blue, and may also be light of other colors.

In an optional embodiment of the present disclosure, the light-emitting element 81 is a light-emitting diode (LED) chip. In other embodiments, the light-emitting element 81 may also be a sub-millimeter light-emitting diode (mini-LED) chip or a micron light-emitting diode (micro-LED) chip, etc.

In an optional embodiment of the present disclosure, light-emitting manners of the first light-emitting unit 82 and the second light-emitting unit are quantum dot light-emitting. In other embodiments, the light-emitting manners of the first light-emitting unit 82 and the second light-emitting unit may also be organic material light-emitting or the like.

Figure 6:
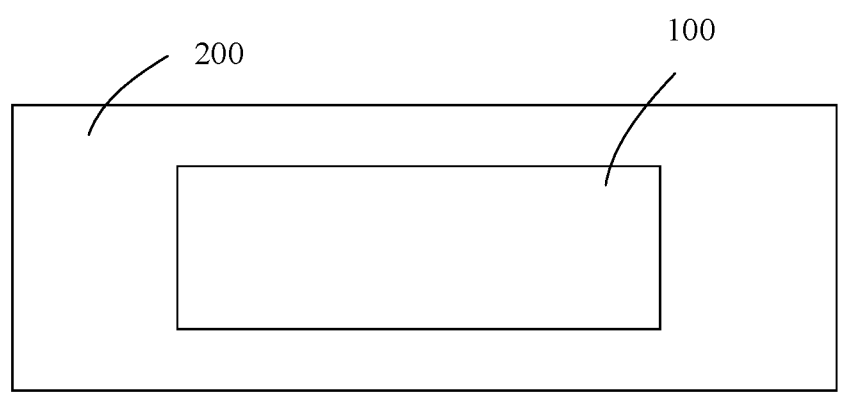
FIG. 6 is a cross-sectional view after forming first light-emitting units and second light-emitting units on the driving backplane shown in FIG. 5.

Referring to FIG. 6, the present disclosure further provides a display terminal 1000. The display terminal 1000 includes a main body portion 200 and the hybrid display device 100 as described above, and the hybrid display device 100 is formed on the main body portion 200.

In the hybrid display device, the manufacturing method of the hybrid display device, and the display terminal provided by the present disclosure, the pressure-resistant layer is formed on the first passivation protection layer of the driving backplane, and the first anode, and a second anode, and an auxiliary cathode are formed on the pressure-resistant layer, an undercut groove is defined at a position adjacent to the first anode of the pressure-resistant layer of the driving substrate and the first passivation protective layer of the driving substrate, the light-emitting element is bonded to the first anode and the auxiliary cathode, the light-emitting unit is formed on the first anode, and finally the common cathode is formed on the light-emitting unit. Due to the existence of the undercut groove, the common cathode is disconnected at the undercut groove to cut off an electrical contact between the first anodes and the common cathode, so that a device failure caused by a short circuit of the first anode caused by an overlap between the common cathode and the first anodes can be avoided.

In addition, a thickness of the pressure-resistant layer corresponding to at least one of the first driving transistors, the second driving transistors, and the third driving transistors is less than a thickness of the pressure-resistant layer corresponding to the first anodes, the auxiliary cathode, the second anode, and the third anode. In this way, a height difference between the first anode and the pressure-resistant layer located above the first driving transistors and the transistor can be reduced, and a height difference between the auxiliary cathode and the pressure-resistant layer located above the first driving transistors and the transistor can be reduced, so that problems such as dark lights, light outages, and dark spots in the hybrid display device can be avoided.

Furthermore, a surface of the light-shielding layer away from the first driving transistor and a surface of the first anode away from the pressure-resistant layer are on a same horizontal plane, a height difference between the first anode and the pressure-resistant layer 50 above the driving transistor and the second driving transistor is 0, and a height difference between the auxiliary cathode and the pressure-resistant layer above the driving transistor and the second driving transistor is 0, which can further improve the transfer and binding yields of the light-emitting element.

The hybrid display device, the manufacturing method of the hybrid display device, and the display terminal provided by the embodiments of the present disclosure have been described above in detail, principles and implementations of the present disclosure are described with specific examples in this paper. The descriptions of the above embodiments are only used to help understand the technical solution of the present disclosure and its core idea; those of ordinary skill in the art should understand that: it can still modify the technical solutions recorded in the foregoing embodiments, or perform equivalent replacements to some of the technical features; and these modifications or substitutions do not make the essence of the corresponding technical solutions depart from the scope of the technical solutions of the embodiments of the present disclosure.

What is claimed is:

1. A hybrid display device, comprising:
   a driving backplane comprising a driving circuit layer, a first passivation protection layer, and a pressure-resistant layer stacked in sequence; wherein the driving backplane is defined with at least one undercut groove, and the undercut groove penetrates the first passivation protection layer and the pressure-resistant layer; and
   a light-emitting structure layer comprising an electrode layer, a common cathode, a plurality of light-emitting elements, and a plurality of first light-emitting units; wherein the electrode layer is formed on the pressure-resistant layer and is electrically connected to the driving circuit layer, the light-emitting elements and the first light-emitting units are all formed on the electrode layer, and the common cathode is formed on the first light-emitting units;
   wherein the electrode layer comprises a plurality of first anodes, a plurality of auxiliary cathodes, and a plurality of second anodes, and the light-emitting elements are bond to the driving backplane through the first anodes and the auxiliary cathodes; the first light-emitting units are formed between the second anodes and the common cathode; the undercut groove is adjacent to the first anodes, the common cathode is disconnected at the undercut groove, and a gap is defined between the common cathode and the first anodes.

2. The hybrid display device as claimed in claim 1, wherein the driving circuit layer comprises a plurality of first driving transistors, the first driving transistors comprise first sources and first drains; the undercut groove comprises a first groove and a second groove, the first groove penetrates the pressure-resistant layer, and the second groove penetrates the first passivation protection layer; the first groove is arranged opposite to the second groove, and a size of an opening of the first groove adjacent to the second groove is less than a size of an opening of the second groove adjacent to the first groove; and a part of the first drain is exposed from the second groove, and one of the first anodes is electrically connected to the first drain.

3. The hybrid display device as claimed in claim 2, wherein each of the first driving transistors further comprises signal input terminal, the signal input terminal, the first source, and the first drain are arranged on a same layer, and the auxiliary cathode is electrically connected to the signal input terminal.

4. The hybrid display device as claimed in claim 1, wherein the auxiliary cathodes are electrically connected to the common cathode.

5. The hybrid display device as claimed in claim 2, wherein a thickness of the pressure-resistant layer corresponding to the first driving transistors is less than a thickness of the pressure-resistant layer corresponding to the first anodes.

6. The hybrid display device as claimed in claim 5, wherein the driving backplane further comprises a light-shielding layer, the light-shielding layer is arranged on the pressure-resistant layer and is opposite to the first driving transistors; a surface of the light-shielding layer away from the first driving transistors and surfaces of the first anodes away from the pressure-resistant layer are on a same horizontal plane.

7. The hybrid display device as claimed in claim 2, wherein the driving backplane further comprises a plurality of second driving transistors and a plurality of third driving transistors; the electrode layer further comprises a plurality of third anodes;
   the second anodes are arranged corresponding to the second driving transistors, and electrically connected to the second driving transistor; and
   the light-emitting structure layer further comprises a plurality of second light-emitting units, each of the second light-emitting units is formed between the third anodes and the common cathode, and the third anodes are electrically connected to the third driving transistors.

8. The hybrid display device as claimed in claim 7, wherein a thickness of the pressure-resistant layer corresponding to the second driving transistors and the third driving transistors is less than a thickness of the pressure-resistant layer corresponding to the first anodes.

9. The hybrid display device as claimed in claim 7, wherein the light-emitting elements are light-emitting diode elements emitting blue light, the first light-emitting units are organic light-emitting units or quantum dot light-emitting units emitting green light, and the second light-emitting units are organic light-emitting units or quantum dot light-emitting units emitting red light.

10. The hybrid display device as claimed in claim 7, wherein the light-emitting structure layer further comprises a plurality of first blocking wall, a plurality of second blocking wall, and a plurality of third blocking wall formed on the pressure-resistant layer, and the common cathode covers the first blocking wall, the second blocking wall, and the third blocking wall;
   the first blocking wall is arranged between the auxiliary cathodes and the second anodes;
   the second blocking wall is arranged between the second anodes and the third anodes, and the third blocking wall is arranged on an outer side of the third anodes;
   a first pixel opening is defined between the first blocking wall and the second blocking wall, and a second pixel opening is defined between the second blocking wall and the third blocking wall; and the first light-emitting units are disposed in the first pixel opening, and the second light-emitting units are disposed in the second pixel opening.

11. The hybrid display device as claimed in claim 1, wherein in a same etching solution, an etching resistance of the pressure-resistant layer is better than an etching resistance of the first passivation protection layer.

12. A display terminal, wherein the display terminal comprises a body portion and a hybrid display device formed on the body portion, and the hybrid display device comprises:
- a driving backplane comprising a driving circuit layer, a first passivation protection layer, and a pressure-resistant layer stacked in sequence; wherein the driving backplane is defined with at least one undercut groove, and the undercut groove penetrates the first passivation protection layer and the pressure-resistant layer; and
- a light-emitting structure layer comprising an electrode layer, a common cathode, a plurality of light-emitting elements, and a plurality of first light-emitting units; wherein the electrode layer is formed on the pressure-resistant layer and is electrically connected to the driving circuit layer, the light-emitting elements and the first light-emitting units are all formed on the electrode layer, and the common cathode is formed on the first light- emitting unit;
- wherein the electrode layer comprises a plurality of first anodes, a plurality of auxiliary cathodes, and a plurality of second anodes, and the light-emitting elements are bond to the driving backplane through the first anodes and the auxiliary cathodes; the first light-emitting units are formed between the second anodes and the common cathodes; the undercut groove is adjacent to the first anodes, the common cathode is disconnected at the undercut groove, and a gap is provided between the common cathode and the first anodes.

13. The display terminal as claimed in claim 12, wherein the driving circuit layer comprises a plurality of first driving transistors, each of the first driving transistors comprises a first source and a first drain; the undercut groove comprises a first groove and a second groove, the first groove penetrates the pressure-resistant layer, and the second groove penetrates the first passivation protection layer; the first groove is arranged opposite to the second groove, and a size of an opening of the first groove adjacent to the second groove is less than a size of an opening of the second groove adjacent to the first groove;
- a part of the first drain is exposed from the second groove, and one of the first anodes is electrically connected to the first drain.

14. The display terminal as claimed in claim 13, wherein each of the first driving transistors further comprises a signal input terminal arranged in a same layer as the first source and the first drain, and one of the auxiliary cathodes is electrically connected to the signal input terminal.

15. The display terminal as claimed in claim 12, wherein the auxiliary cathode is electrically connected to the common cathode.

16. The display terminal as claimed in claim 13, wherein a thickness of the pressure-resistant layer corresponding to the first driving transistors is less than a thickness of the pressure-resistant layer corresponding to the first anodes.

17. The display terminal as claimed in claim 16, wherein the driving backplane further comprises a light-shielding layer formed on the pressure-resistant layer and is opposite to the first driving transistors; a surface of the light-shielding layer away from the first driving transistors and surfaces of the first anodes away from the pressure-resistant layer are on a same horizontal plane.

* * * * *